(12) United States Patent
Lin et al.

(10) Patent No.: US 10,126,363 B2
(45) Date of Patent: Nov. 13, 2018

(54) FLIP-FLOP CIRCUIT AND SCAN CHAIN USING THE SAME

(71) Applicant: MEDIATEK INC., Hsin-Chu (TW)

(72) Inventors: Wen-Yi Lin, Tainan (TW);
Girishankar Gurumurthy, Bangalore (IN)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/647,485

(22) Filed: Jul. 12, 2017

(65) Prior Publication Data

US 2018/0224505 A1 Aug. 9, 2018

Related U.S. Application Data

(60) Provisional application No. 62/456,198, filed on Feb. 8, 2017.

(51) Int. Cl.

| | |
|---|---|
| *G01R 31/3185* | (2006.01) |
| *H03K 3/027* | (2006.01) |
| *H03K 19/20* | (2006.01) |
| *G01R 31/3177* | (2006.01) |
| *G01R 31/317* | (2006.01) |

(52) U.S. Cl.
CPC . *G01R 31/318555* (2013.01); *G01R 31/3177* (2013.01); *G01R 31/31723* (2013.01); *G01R 31/31727* (2013.01); *G01R 31/318552* (2013.01); *H03K 3/027* (2013.01); *H03K 19/20* (2013.01)

(58) Field of Classification Search
CPC ...... G01R 31/318555; G01R 31/31723; G01R 31/31727; G01R 31/3177; G01R 31/318552; H03K 3/027; H03K 19/20

USPC ................................. 714/726, 729, 727, 724
See application file for complete search history.

(56) References Cited

U.S. PATENT DOCUMENTS

| | | | |
|---|---|---|---|
| 5,642,364 A | 6/1997 | Farwell | |
| 6,266,793 B1 | 7/2001 | Mozdzen et al. | |
| 6,374,380 B1* | 4/2002 | Sim | G01R 31/318536 714/727 |
| 6,446,230 B1* | 9/2002 | Chung | G01R 31/318555 714/726 |
| 6,487,688 B1* | 11/2002 | Nadeau-Dostie | G01R 31/318558 714/726 |

(Continued)

OTHER PUBLICATIONS

Kumar et al., A Robust Pulsed Flip-flop and its use in Enhanced Scan Design, 2009, IEEE, pp. 97-102.*

*Primary Examiner* — John J Tabone, Jr.
(74) *Attorney, Agent, or Firm* — McClure, Qualey & Rodack, LLP

(57) ABSTRACT

A flip-flop circuit is provided. The flip-flop circuit receives a test signal at a test-in terminal and a data signal at a data-in terminal and generates a scan-out signal. The flip-flop circuit includes a buffer and a scan flip-flop. The buffer has an input terminal coupled to the test-in terminal and an output terminal and further has a first power terminal and a second power terminal. The buffer operates to generate a buffering signal. The scan flip-flop receives the buffering signal and the data signal. The scan flip-flop is controlled by a test-enable signal to generate the scan-out signal according to the buffering signal or the data signal. The scan flip-flop further generates a test-enable reverse signal which is the reverse of the test-enable signal. The first power terminal of the buffer receives the test-enable signal or the test-enable reverse signal.

20 Claims, 14 Drawing Sheets

(56) References Cited

U.S. PATENT DOCUMENTS

| | | | |
|---|---|---|---|
| 6,665,828 B1* | 12/2003 | Arimilli | G01R 31/318385 365/201 |
| 7,649,395 B2 | 1/2010 | Ahmadi | |
| 8,928,381 B1* | 1/2015 | Goh | G01R 31/318541 326/38 |
| 9,291,674 B1* | 3/2016 | Lu | G01R 31/3177 |
| 9,529,044 B1* | 12/2016 | Taneja | G01R 31/318558 |
| 2003/0023941 A1* | 1/2003 | Wang | G01R 31/31704 716/103 |
| 2005/0283691 A1* | 12/2005 | Chae | G01R 31/318536 714/726 |
| 2006/0041802 A1* | 2/2006 | Grise | G01R 31/318541 714/724 |
| 2007/0260951 A1* | 11/2007 | Subramanian | G01R 31/318541 714/726 |
| 2008/0126898 A1* | 5/2008 | Pandey | G01R 31/318544 714/731 |
| 2008/0141087 A1* | 6/2008 | Whetsel | G01R 31/3177 714/726 |
| 2009/0201049 A1 | 8/2009 | Bernasconi et al. | |
| 2010/0332928 A1* | 12/2010 | Li | G01R 31/318552 714/731 |
| 2014/0125377 A1* | 5/2014 | Lin | H03K 3/356121 326/16 |
| 2015/0082108 A1* | 3/2015 | Goel | G01R 31/318513 714/726 |
| 2015/0316605 A1* | 11/2015 | Deutsch | G01R 31/318547 702/117 |
| 2016/0097811 A1* | 4/2016 | Kim | G01R 31/318541 714/726 |
| 2016/0187421 A1* | 6/2016 | Oshiyama | G01R 31/3177 714/729 |
| 2017/0292993 A1* | 10/2017 | Yoon | G01R 31/3177 |

* cited by examiner

FLIP-FLOP CIRCUIT AND SCAN CHAIN USING THE SAME

CROSS REFERENCE TO RELATED APPLICATIONS

This application claims the benefit of U.S. Provisional Application No. 62/456,198, filed on Feb. 8, 2017, the contents of which are incorporated herein by reference.

BACKGROUND OF THE INVENTION

Field of the Invention

The invention relates to a flip-flop circuit, and more particularly, to a flip-flop circuit applied in a scan chain for testing.

Description of the Related Art

Scan chains are applied to detect various manufacturing faults in combinatorial logic blocks during test procedures. Generally, a scan chain is composed of several scan flip-flops which are coupled in series. However, due to process, voltage, and temperature (PVT) variation and clock skew, the hold-time violation of the scan flip-flop become more serious. Thus, to fix the hold-time violation, a delay chain composed of several buffers is added in the scan path between the data output terminal of one scan flip-flop and the scan-in terminal of the following scan flip-flop. These additional buffers would occupy large area of the circuit board. Moreover, these additional buffers would also consume unnecessary power, especially, when the scan chain operates in a normal mode.

BRIEF SUMMARY OF THE INVENTION

One exemplary embodiment of a flip-flop circuit is provided. The flip-flop circuit receives a test signal at a test-in terminal and a data signal at a data-in terminal and generates a scan-out signal. The flip-flop circuit comprises a buffer and a scan flip-flop. The buffer has an input terminal coupled to the test-in terminal and an output terminal and further has a first power terminal and a second power terminal. The buffer operates to generate a buffering signal. The scan flip-flop receives the buffering signal and the data signal. The scan flip-flop is controlled by a test-enable signal to generate the scan-out signal according to the buffering signal or the data signal. The scan flip-flop further generates a test-enable reverse signal which is the reverse of the test-enable signal. The first power terminal of the buffer receives the test-enable signal or the test-enable reverse signal.

Another exemplary embodiment of a scan chain is provided. The scab chain comprises a first flip-flop circuit, a second flip-flop circuit, and a combinatorial logic circuit. Each of the first and second flip-flop circuits receives a test signal at a test-in terminal, receives a data signal at a data-in terminal, receives a teat-enable signal at a test-enable terminal, and generates a scan-out signal at a date-out terminal. The combinatorial logic circuit is coupled between the data-out terminal of the first flip-flop circuit and the data-in terminal of the second flip-flop circuit. The second flip-flop circuit receives the scan-out signal generated by the first flip-flop circuit through the corresponding the test-in terminal to serve as the test signal for the second flip-flop. Each of the first and second flip-flop circuits comprises a buffer and a scan flip-flop. The buffer has an input terminal coupled to the test-in terminal and an output terminal and further has a first power terminal and a second power terminal. The buffer operates to generate a buffering signal. The scan flip-flop receives the buffering signal and the data signal and controlled by the test-enable signal to generate the scan-out signal according to the buffering signal or the data signal. The scan flip-flop further generates a test-enable reverse signal which is the reverse of the test-enable signal. The first power terminal of the buffer receives the test-enable signal or the test-enable reverse signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
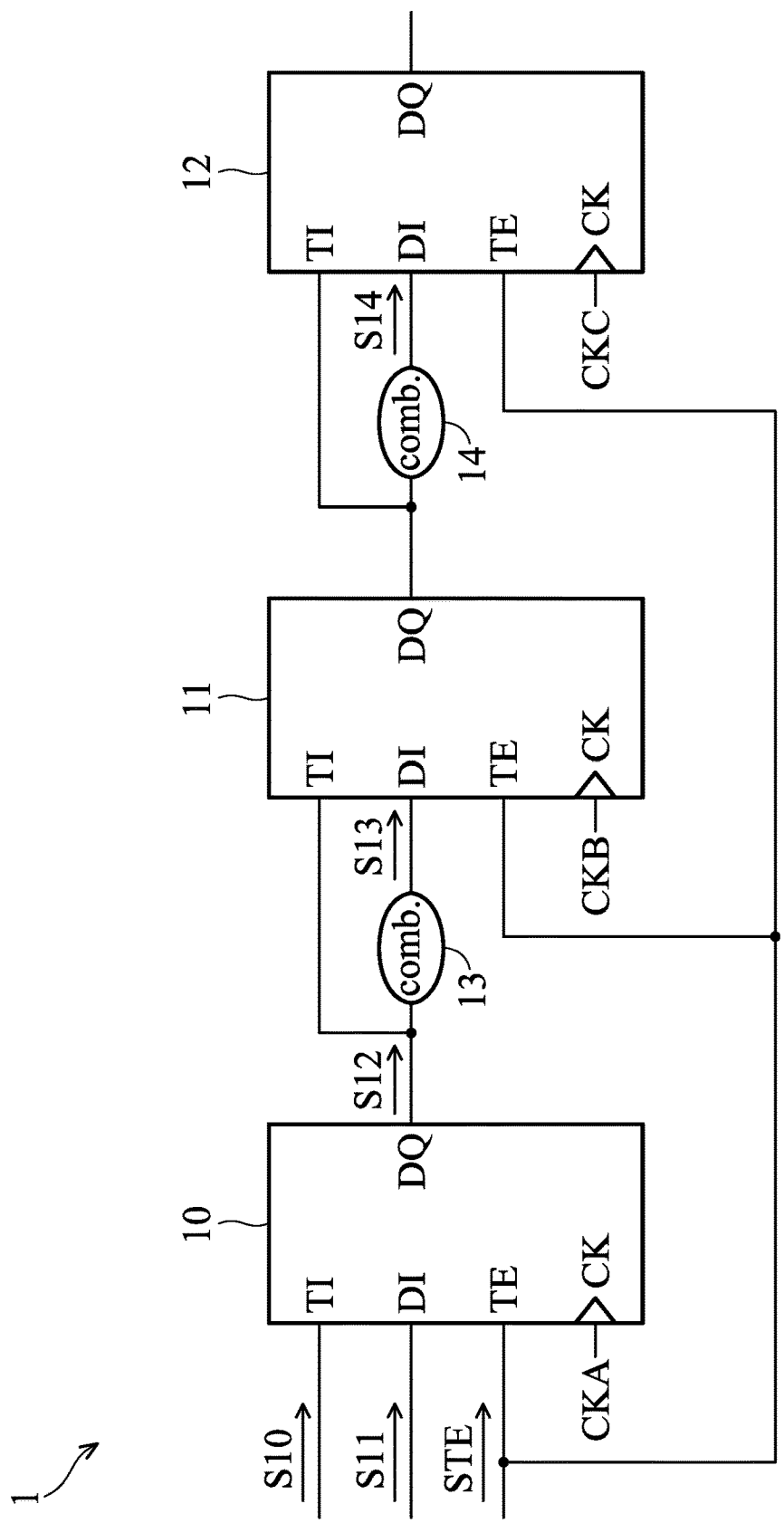
FIG. 1 shows an exemplary embodiment of a scan chain.

FIG. 1 shows an exemplary embodiment of a scan chain. As shown in FIG. 1, a scan chain 1 comprises a plurality of scan flip-flops and at least one combinatorial logic circuits coupled between two successively scan flip-flops. In the embodiment of FIG. 1, three scan flip-flops 10-12 and two combinatorial logic circuits (comb.) 13 and 14 are given as an example. The scan chain 1 performs scan testing to detect any manufacturing fault in these combinatorial logic circuits 13 and 14. Each of the scan flip-flops 10-12 has a test-in terminal TI, a data-in terminal DI, a clock-in terminal CK, and a data-out terminal DQ. The scan line 1 can selectively operate in a normal mode or a test mode in response to a test-enable signal STE. The test-enable terminals TE of the scan flip-flops 10-12 receive the same test-enable signal STE. The clock-in terminals CK of the scan flip-flops 10-12 receive clock signals CKA-CKC. In an embodiment, the clock signals CKA-CKC are generated by different clock sources, and the timing of the clock signals CKA-CKC are the same or different. In another embodiment, the clock signals CKA-CKC are generated by the same clock source, and the timing of the clock signals CKA-CKC are the same or different. The scan flip-flop 10 is the first one among the scan flip-flops 10-12. The data-in terminal DI of the scan flip-flop 10 receives a functional data signal S11 to serve as its data signal, and the test-in terminal TI thereof receives a scan test signal S10 to serve as its test signal. The flip-flop circuit 10 generates a scan-out signal S12 at its data-out terminal DQ, and the scan-out signal S12 is transmitted to the combinatorial logic circuit 13. For each of the scan output flip-flops 11 and 12, the data-in terminal DI receives the signal output from the corresponding combinatorial logic circuit to serve as its data signal, the test-in terminal TI receives the scan-out signal output from the data-out terminal DQ of the previously flip-flop circuit to serve as its test signal, and the scan-out signal output by the data-out terminal DQ is transmitted to the following combinatorial logic circuit.

Figure 2A:
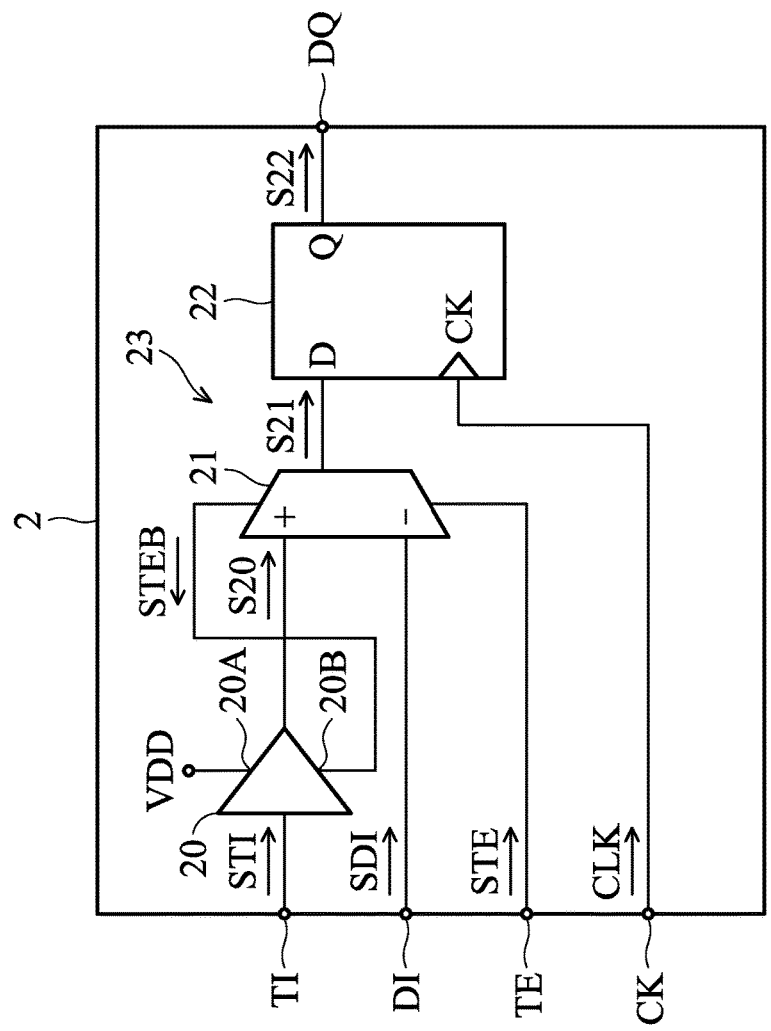
FIG. 2A shows one exemplary embodiment of a flip-flop circuit.

FIG. 2A shows one exemplary embodiment of a flip-flop circuit. At least one of the flip-flop circuits 10-12 shown in FIG. 1 may have the same structure shown in FIG. 2A, that is, at least one of the flip-flop circuits 10-12 may be implemented by the flip-flop circuit 2 of the embodiment of FIG. 2A. As shown in FIG. 2A, the flip-flop circuit 2 comprises a buffer 20 and a scan flip-flop 23. The scan flip-flop 23 comprises a multiplexer 21 and a D flip-flop 22. The buffer 20 receives a test signal STI from the test-in terminal TI of the flip-flop circuit 2 and generates a buffering signal S20. One input terminal (+) of the multiplexer 21 receives the buffering signal S20, and the other input terminal (−) thereof receives a data signal SDI from the data-in terminal DI of the flip-flop circuit 2. The multiplexer 21 is controlled by a test-enable signal STE from the test-enable terminal TE of the flip-flop circuit 2 to selectively transmit the buffering signal S20 or the data signal SDI to its output terminal to serve as an input signal S21. The input terminal (D) of the D flip-flop 22 receives the input signal S21, and the clock terminal (CK) is coupled to the clock terminal CK of the flip-flop circuit 2 to receive a corresponding clock signal CLK. The D flip-flop 22 operates based on the clock signal CLK to generate a scan-out signal S22 according to the input signal S21. The flip-flop circuit 2 transmits the scan-out signal S22 to the following circuit or device through its data-out terminal DQ.

Referring to FIG. 2A, the buffer 20 has two power terminals 20A and 20B. In the embodiment, the power terminal S20A receives a supply voltage VDD which is used to power the flip-flop circuit 2, while the power terminal S20B receives a test-enable reverse signal STEB which is generated internally to be the reverse of the test-enable signal STE. In the embodiment, the test-enable reverse signal STEB is generated by the multiplexer 21. The test-enable signal STE and the test-enable reverse signal STEB are used for operating the test mode, and can be respectively seen as a first test-enable signal and a second test-enable signal.

Figure 2B:
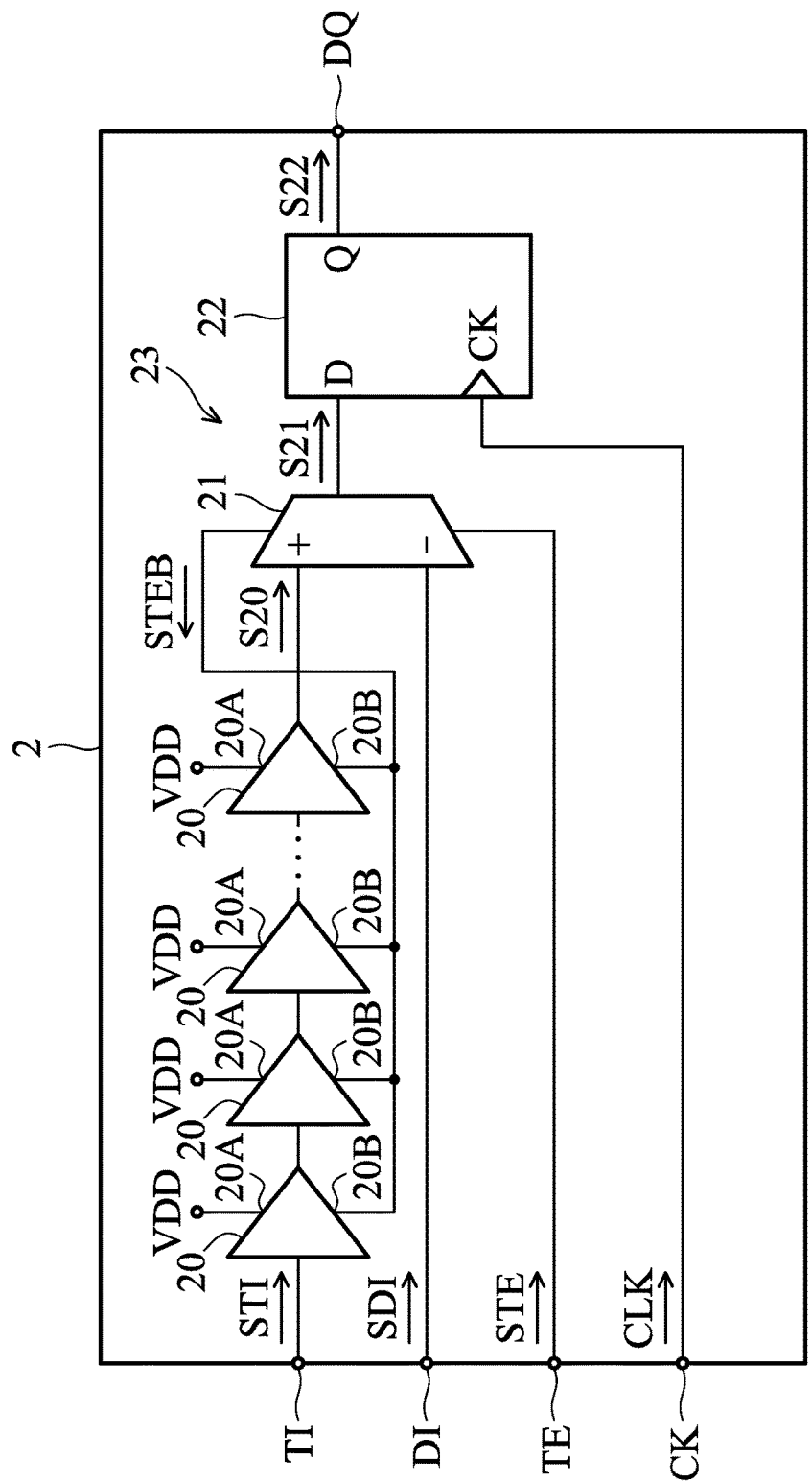
FIG. 2B shows another exemplary embodiment of a flip-flop circuit.

In the embodiment of FIG. 2A, there is one buffer 20 in the flip-flop circuit 2. However, in other embodiments, the flip-flop circuit 2 may comprise several buffers 20 coupled in series to obtain longer delay time for the test signal STI, as shown in FIG. 2B. Accordingly, the buffers 20 operate together to generate the buffering signal S20 according to the test signal STI.

Figure 3:
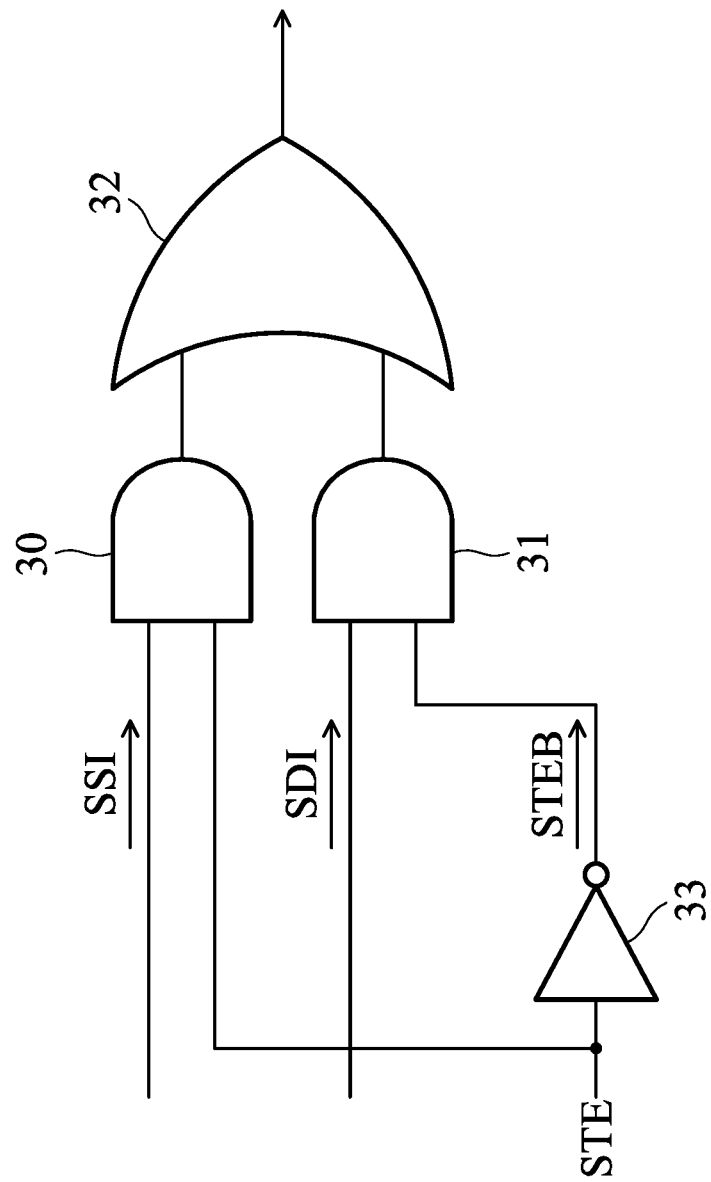
FIG. 3 shows an exemplary embodiment of a multiplexer.

FIG. 3 shows one exemplary embodiment of a multiplexer. The multiplexer 21 shown in FIG. 2A may have the same structure shown in FIG. 3, that is, the multiplexer 21 may be implemented by the multiplexer 3 of the embodiment of FIG. 3. The multiplexer 3 comprises AND gates 30 and 31, an OR gate 32, and an inverter 33. The input terminal of the inverter 33 receives the test-enable signal STE. The inverter 33 invers the test-enable signal STE to generate the test-enable reverse signal STEB. Thus, the test-enable reverse signal STEB is the reverse of the test-enable signal STE. One input terminal of the AND gate 30 receives a scan-in signal SSI, and the other input terminal thereof receives the test-enable signal STE. One input terminal of the AND gate 31 receives the data signal SDI, and the other input terminal thereof receives the test-enable reverse signal STEB. The input terminals of the OR gate 32 are coupled to the AND gates 30 and 31 to receives the signals output from the AND gates 30 and 31 to generate an output signal. In the embodiment where the multiplexer 21 is implemented by the multiplexer 3, the AND gate 30 receives the buffering signal S20 generated by the buffer 20 to serve as the scan-in signal SSI, and the OR gate 32 outputs its output signal to serve as the input signal S21. The test-enable reverse signal STEB is provided to the power terminal 20B of the buffer 20.

Figure 4:
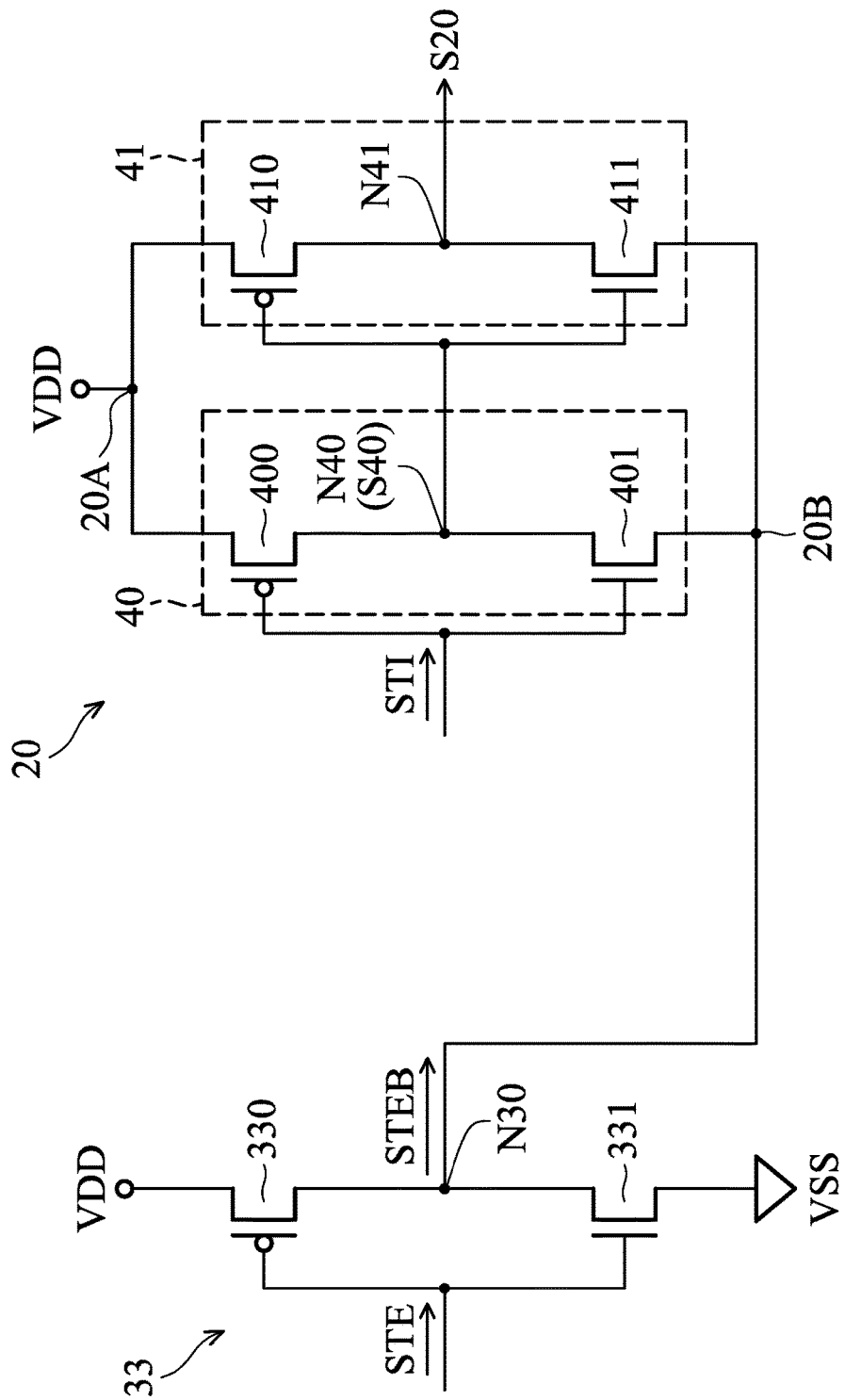
FIG. 4 shows an exemplary embodiment of a buffer in the flip-flop circuit of FIG. 2A.

FIG. 4 shows an exemplary embodiment of the buffer 20 (such as FIGS. 2A and 2B shows). In order to illustrate the structure and operation of the buffer 20, FIG. 4 also shows the inverter 33 in the multiplexer 3. Referring to FIG. 4, the inverter 33 comprises a P-type metal-oxide-semiconductor (PMOS) transistor 330 and an N-type metal-oxide-semiconductor (NMOS) transistor 331. The gate of the PMOS transistor 330 receives the test-enable signal STE, the source thereof receives the supply voltage VDD, and the drain thereof is coupled to a node N30. The gate of the NMOS transistor 331 receives the test-enable signal STE, the drain thereof is coupled to the node N30, and the source thereof receives a supply voltage VSS which is used to power the flip-flop circuit 2. In the embodiment, the supply voltage VSS is lower than the supply voltage VDD. For example, the supply voltage VSS is a voltage of the ground. The test-enable reverse signal STEB is generated at the node N30.

Also referring to FIG. 4, the buffers 20 comprises inverters 40 and 41. The inverter 40 is composed of a PMOS transistor 400 and an NMOS transistor 401. The gate of the PMOS transistor 400 receives the test signal STI, the source thereof is coupled to the power terminal 20A to receive the supply voltage VDD, and the drain thereof is coupled to a node N40. The gate of the NMOS transistor 401 receives the test signal STI, the drain thereof is coupled to the node N40, and the source thereof is coupled to the power terminal 20B to receive the test-enable reverse signal STEB. There is a signal S40 generated at the node N40. The inverter 41 is composed of a PMOS transistor 410 and an NMOS transistor 411. The gate of the PMOS transistor 410 is coupled to the node N40 to receive the signal S40, the source thereof is coupled to the power terminal 20A to receive the supply voltage VDD, and the drain thereof is coupled to a node N41. The gate of the NMOS transistor 411 is coupled to the node N40 to receive the signal S40, the drain thereof is coupled to the node N41, and the source thereof is coupled to the power terminal 20B to receive the test-enable reverse signal STEB. The buffering signal S20 is generated at the node N41.

Figure 5A:
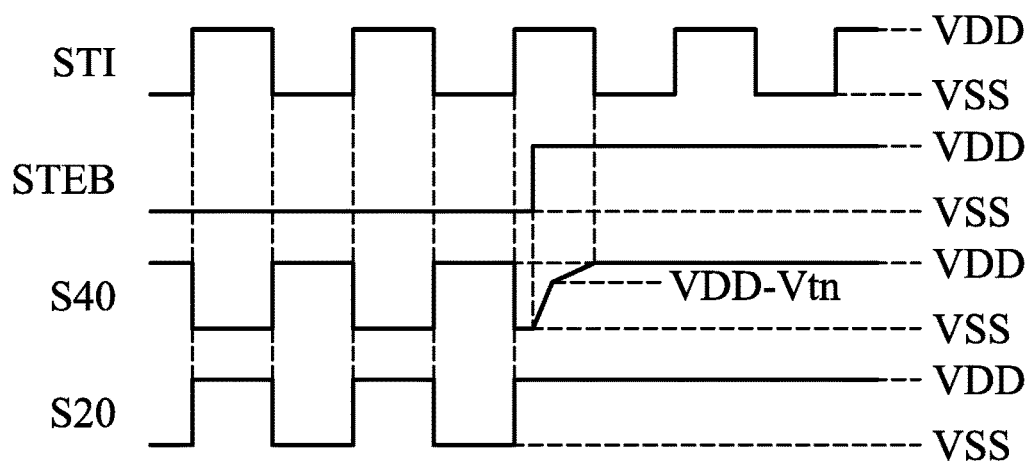
FIGS. 5A and 5B are schematic views showing timing chart of main signals of the flip-flop circuit of FIG. 2A in various cases.
Figure 5B:
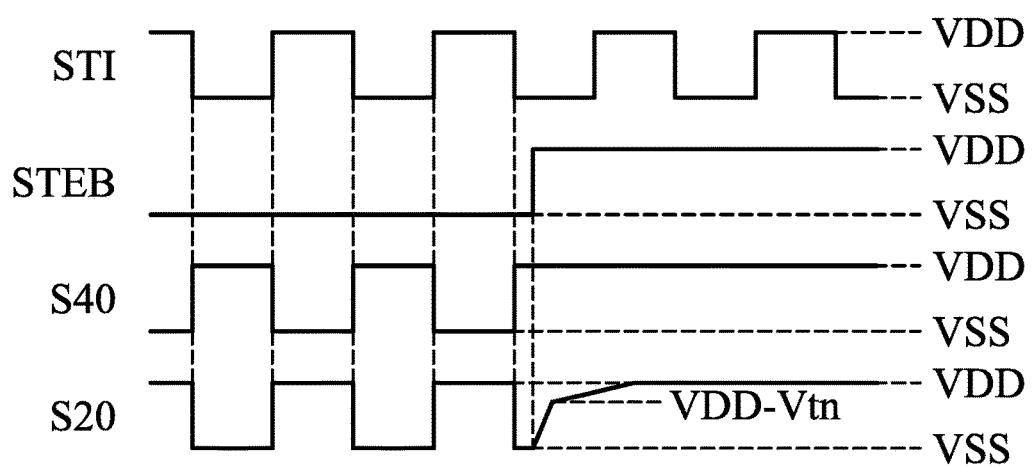

Referring to FIGS. 4 and 5A-5B, when the test-enable signal STE is at a high voltage level, such as the level of the supply voltage VDD, the scan line 1 operates in the test mode. Through the operation of the inverter 33, the test-enable reverse signal STEB is at a low voltage level, such as the level of the supply voltage VSS, during the test mode. As shown in FIGS. 5A and 5B, during the test mode, the level of the signal S40 is the reverse of the test signal STI through the operation of the inverter 40, while the level of the buffering signal S20 is the reverse of the signal S40 through the operation of the inverter 41. Thus, the level of the buffering signal S20 varies with the variation in the voltage level of the test signal STI, and the phase of the buffering signal S20 is the same as the phase of the test signal STI. Referring to FIG. 4, there are two stacked NMOS transistors 401 and 331 between the node N40 and the supply voltage VSS. Thus, the delay time when the signal S40 is switched to the level of the supply level VSS from the level of the supply voltage VDD is enlarged due to the two stacked NMOS transistors 401 and 331. In other words, during the test mode, the falling delay (not shown) of the signal S40 is enlarged. Also referring to FIG. 4, there are two stacked NMOS transistors 411 and 331 between the node N41 and the supply voltage VSS. Thus, the delay time when the buffering signal S20 is switched to the level of the supply level VSS from the level of the supply voltage VDD is enlarged due to the two stacked NMOS transistors 411 and 331. In other words, during the test mode, the falling delay (not shown) of the buffering signal S20 is enlarged. Referring to FIG. 2A, at the test mode, the multiplexer 21 transmits the buffering signal S20 to its output terminal according to the test-enable signal STE to serve as the input signal S21, and The D flip-flop 22 operates based on the clock signal CLK to generate the scan-out signal S22 according to the input signal S21.

As described above, for one flip-flop circuit 2, since the falling delay of each of the signal S40 and the buffering signal S20 is enlarged, the delay time for the signal received by the flip-flop circuit 2 is also enlarged. Compared with a conventional delay chain, less buffers 20 are applied to achieve a predetermined delay time, Referring to FIGS. 4 and 5A-5B, when the test-enable signal STE is at the level of the supply voltage VSS, the scan line 1 operates in the normal mode. Through the operation of the inverter 33, the test-enable reverse signal STEB is the level of the supply voltage VDD during the test mode. In some cases, the test-enable signal STE is switched to the level of the supply voltage VSS from the level of the supply voltage VDD (that is, the test-enable reverse signal STEB is switched to the level of the supply voltage VDD from the level of the supply voltage VSS) during the period when the test signal STI is at the level of the supply voltage VDD, as shown in FIG. 5A. Referring to FIG. 5A, during the period when the test signal STI is at the level of the supply voltage VDD, the NMOS transistor 401 is turned on. In response to the level switching of the test-enable reverse signal STEB, the level of the signal S40 starts increasing toward the level of the difference (VDD−Vtn) between the supply level VDD and the threshold Vtn of the NMOS transistor 401 and then increases toward the level of the supply level VDD from the level of the difference (VDD−Vtn). Once the test signal STI is switched to the level of the supply voltage VSS from the level of the supply voltage VDD to turn on the PMOS transistor 400, the level of the signal S40 is switched to the level of the supply voltage VDD. Then, the level of the signal S40 is kept at the level of the supply voltage VDD during the normal mode.

Also referring to FIG. 5A, in the short period occurring before the time point when the test-enable reverse signal STEB is switched to the level of the supply voltage VDD from the level of the supply voltage VSS (that is, before the time point when the scan chain 1 enters the normal mode from the test mode), since the PMOS transistor 410 is turned on according to the signal S40 with the level of the supply voltage VSS, the level of the buffering signal S20 is already at the level of the supply voltage VDD. During the test mode, since the NMOS transistor 411 is continuously turned on by the signal S40, the level of the buffering signal S20 is still kept at the level of the supply voltage VDD in response to test-enable reverse signal STEB.

In some cases, the test-enable signal STE is switched to the level of the supply voltage VSS from the level of the supply voltage VDD (that is, the test-enable reverse signal STEB is switched to the level of the supply voltage VDD from the level of the supply voltage VSS) during the period when the test signal STI is at the level of the supply voltage VSS, as shown in FIG. 5B. Referring to FIG. 5B, in the short period occurring before the time point when the test-enable reverse signal STEB is switched to the level of the supply voltage VDD from the level of the supply voltage VSS (that is, before the time point when the scan chain 1 enters the normal mode from the test mode), since the PMOS transistor 400 is turned on according to the test signal STI with the level of the supply voltage VSS, the level of the signal S40 is already at the level of the supply voltage VDD. During the normal mode, no matter what level the test signal STI is at, the signal S40 is still kept at the level of the supply voltage VDD because of the level of the supply voltage VDD at both of the power terminals 20A and 20B.

Also referring to FIG. 5B, during the period when the signal S40 is at the level of the supply voltage VDD, the NMOS transistor 411 is turned on. In response to the level switching of the test-enable reverse signal STEB, the level of the buffering signal S20 starts increasing toward the level of the difference (VDD−Vtn) and then increases toward the level of the supply level VDD from the level of the difference (VDD−Vtn). After the level of the buffering signal S20 reaches the level of the supply voltage VDD during the normal mode, the level of the buffering signal S20 is kept at the level of the supply voltage VDD according to the test-enable reverse signal STEB with the level of the supply voltage VDD because the level of the voltage S40 is kept at the level of the supply voltage VDD to turn on the NMOS transistor 411.

According to the above, when the scan chain 1 enters the normal mode, the level of one of the signal S40 and the buffering signal S20 has one transient, and the level of the other one is not changed, which decreases transient power of the buffer 2 during the normal mode.

Figure 6A:
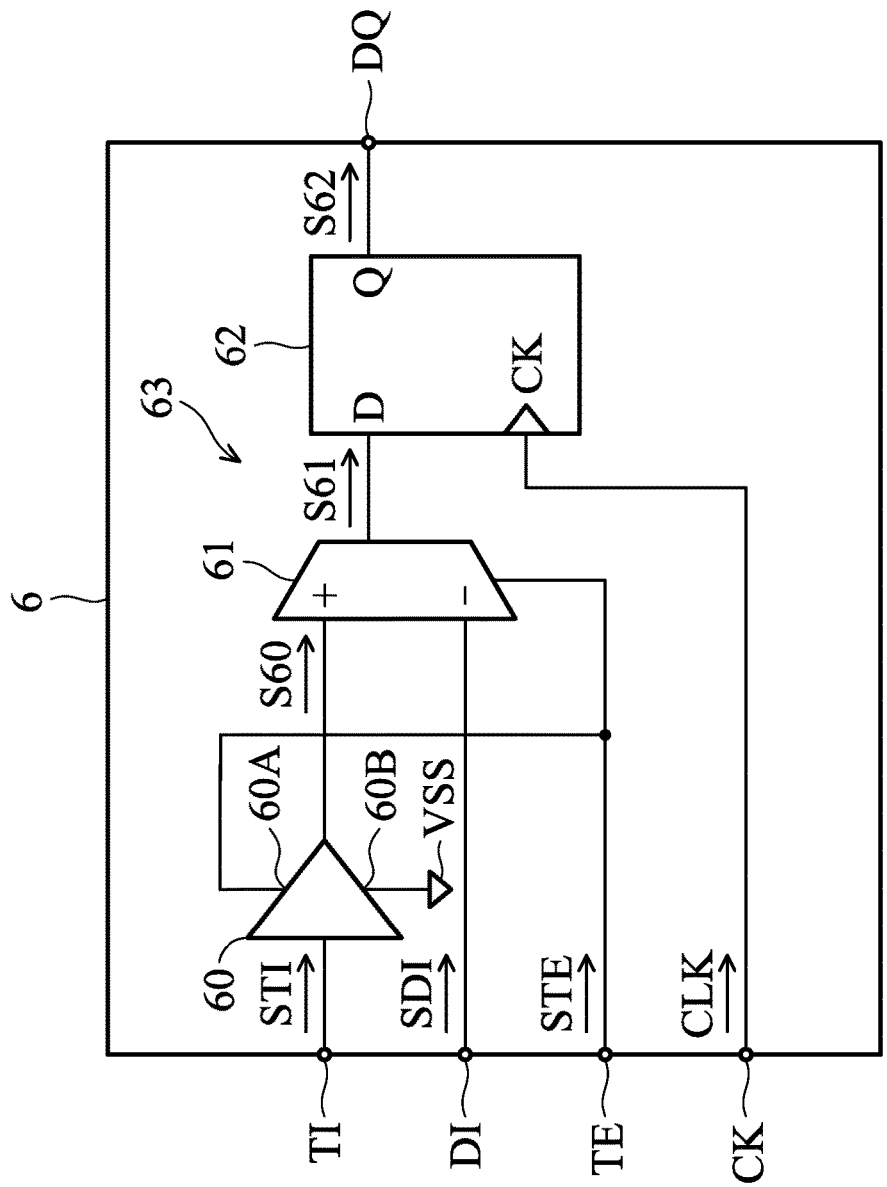
FIG. 6A shows another exemplary embodiment of a flip-flop circuit.

FIG. 6A shows another exemplary embodiment of a flip-flop circuit. At least one of the flip-flop circuits 10-12 shown in FIG. 1 may have the same structure shown in FIG. 6A, that is, at least one of the flip-flop circuits 10-12 may be implemented by the flip-flop circuit 6 of the embodiment of FIG. 6A. As shown in FIG. 6A, the flip-flop circuit 2 comprises a buffer 60 and a scan flip-flop 63. The scan flip-flop 63 comprises a multiplexer 61 and a D flip-flop 62. The connection between the buffer 60, the multiplexer 61, and the D flip-flop 62 and the signals received by them are similar to those in the embodiment of FIG. 2A. Thus, the description related to the similarity is omitted here. The difference between the flip-flop circuits 2 and 6 is that the power terminal S60A of the buffer 60 receives the enable signal STE and the power terminal S60B receives the supply voltage VSS.

The multiplexer 61 shown in FIG. 6A may have the same structure shown in FIG. 3, that is, the multiplexer 61 may be implemented by the multiplexer 3 of the embodiment of FIG. 3. The structure of the multiplexer 3 has been described above, thus, the related description is omitted here. In the embodiment where the multiplexer 61 is implemented by the multiplexer 3, the AND gate 30 receives the buffering signal S60 generated by the buffer 60 to serve as the scan-in signal SSI, and the OR gate 32 outputs its output signal to serve as the input signal S61.

Figure 6B:
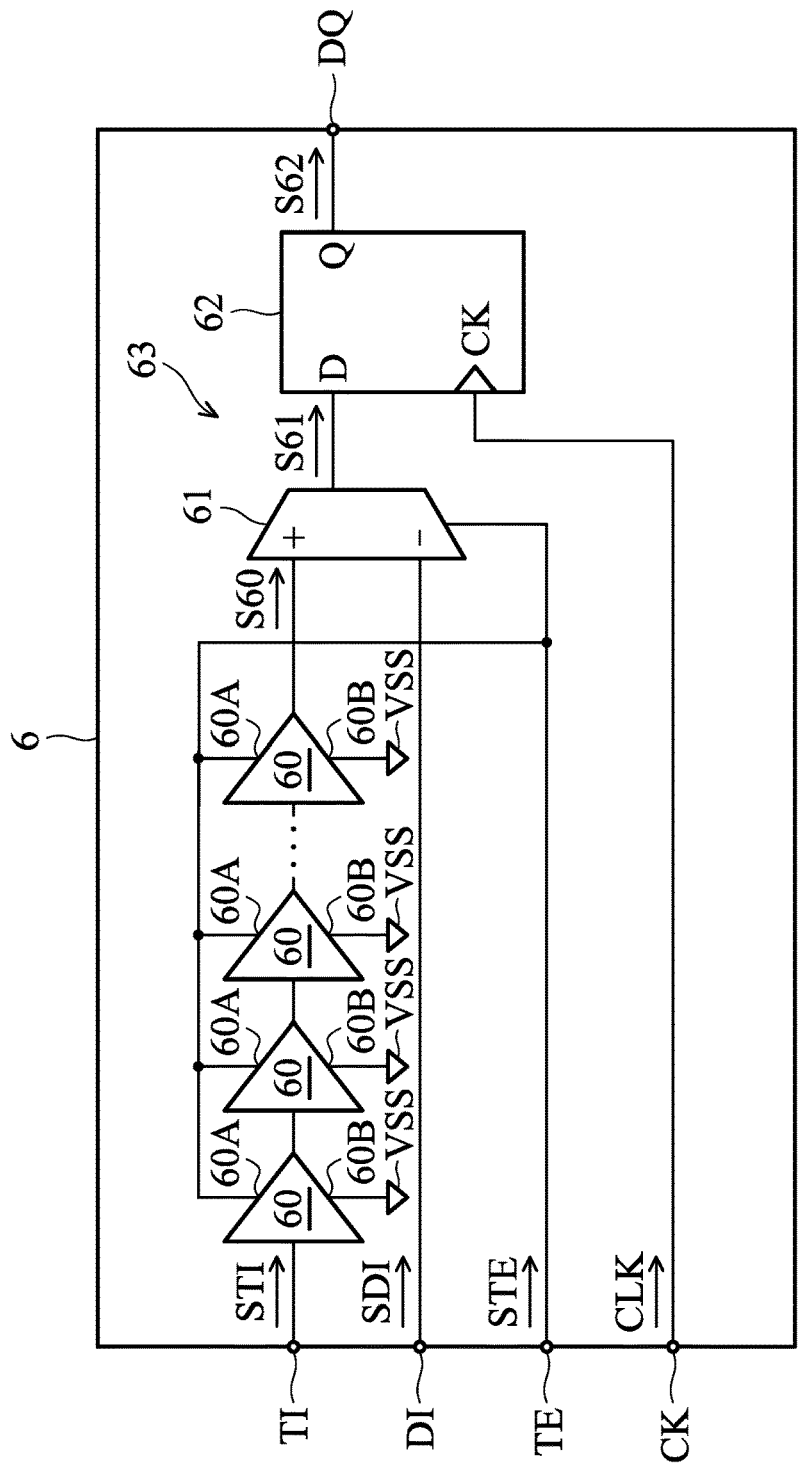
FIG. 6B shows another exemplary embodiment of a flip-flop circuit.

In the embodiment of FIG. 6A, there is one buffer 60 in the flip-flop circuit 6. However, in other embodiments, the flip-flop circuit 6 may comprise several buffers 60 coupled in series to obtain longer delay time for the test signal STI, as shown in FIG. 6B. Accordingly, the buffers 60 operate together to generate the buffering signal S60 according to the test signal STI.

Figure 7:
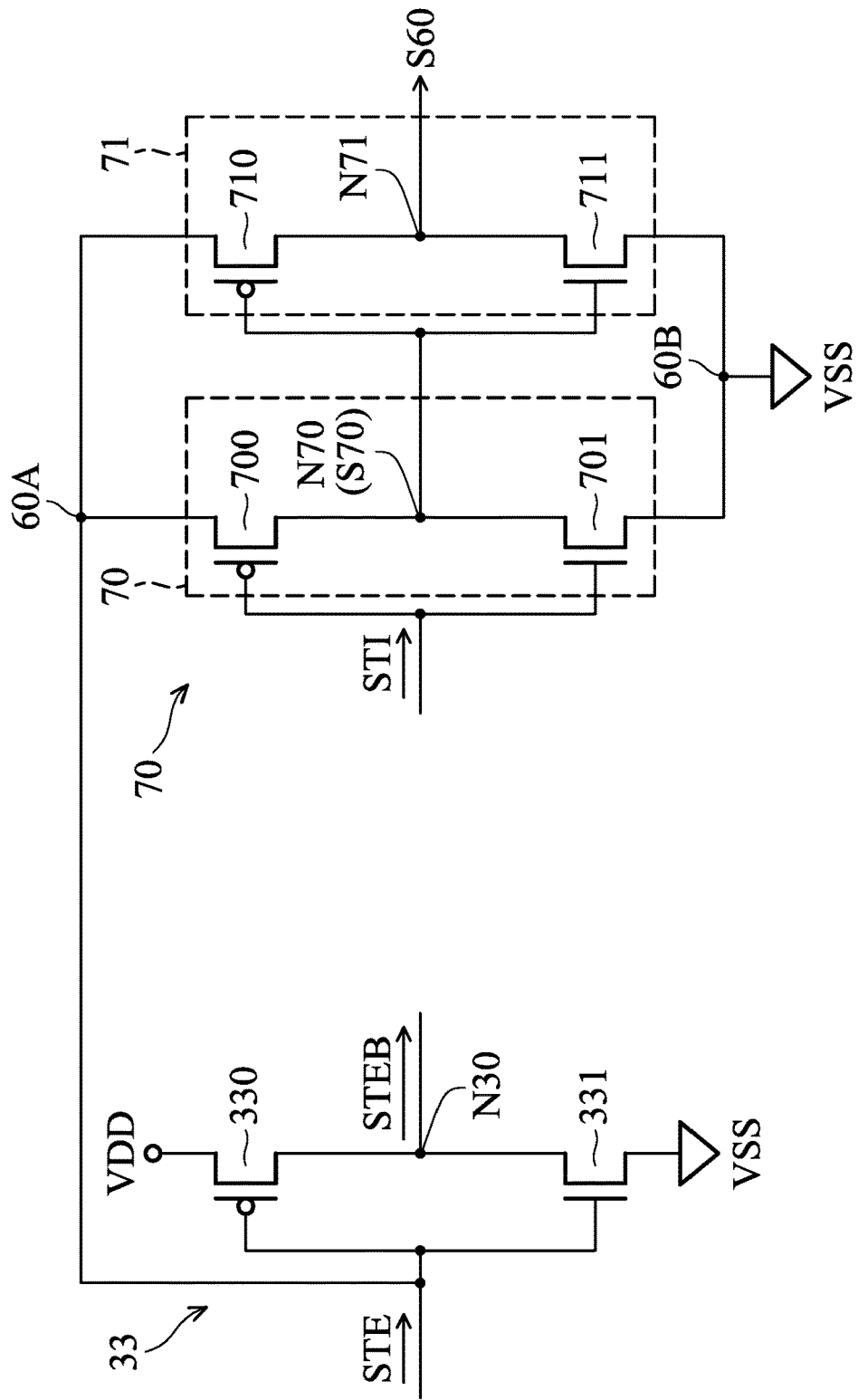
FIG. 7 shows an exemplary embodiment of a buffer in the flip-flop circuit of FIG. 6A.

FIG. 7 shows an exemplary embodiment of the buffer 60 (such as FIGS. 6A and 6B shows). In order to illustrate the structure and operation of the buffer 60, FIG. 7 also shows the inverter 33 in the multiplexer 3. The structure of the inverter 33 has been described above, thus, the related description is omitted here.

Also referring to FIG. 7, the buffers 70 comprises inverters 70 and 71. The inverter 70 is composed of a PMOS transistor 700 and an NMOS transistor 701. The gate of the PMOS transistor 700 receives the test signal STI, the source thereof is coupled to the power terminal 60A to receive the test-enable signal STE, and the drain thereof is coupled to a node N70. The gate of the NMOS transistor 401 receives the test signal STI, the drain thereof is coupled to the node N70, and the source thereof is coupled to the power terminal 60B to receive the supply voltage VSS. There is a signal S70 generated at the node N70. The inverter 71 is composed of a PMOS transistor 710 and an NMOS transistor 711. The gate of the PMOS transistor 710 is coupled to the node N70 to receive the signal S70, the source thereof is coupled to the power terminal 60A to receive the test-enable signal STE, and the drain thereof is coupled to a node N71. The gate of the NMOS transistor 711 is coupled to the node N70 to receive the signal S70, the drain thereof is coupled to the node N71, and the source thereof is coupled to the power terminal 60B to receive the supply voltage VSS. The buffering signal S60 is generated at the node N71.

Figure 8A:
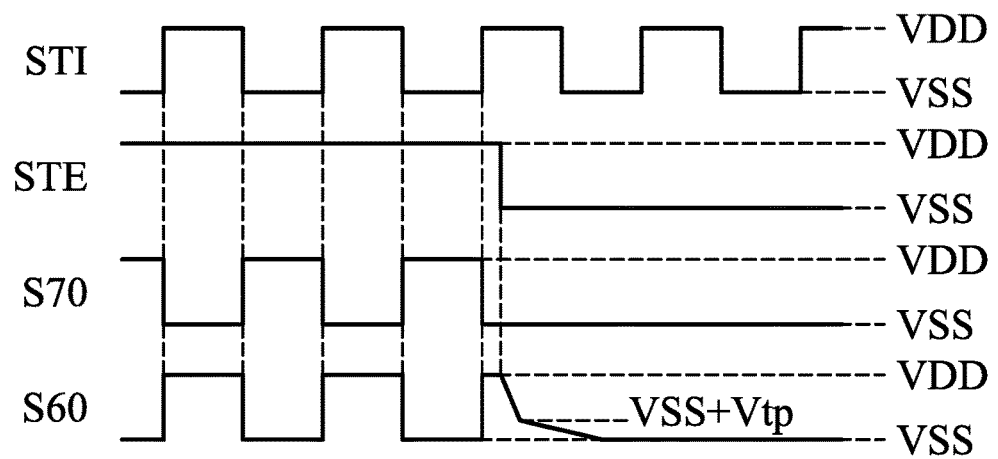
FIGS. 8A and 8B are schematic views showing timing chart of main signals of the flip-flop circuit of FIG. 6A in various cases.
Figure 8B:
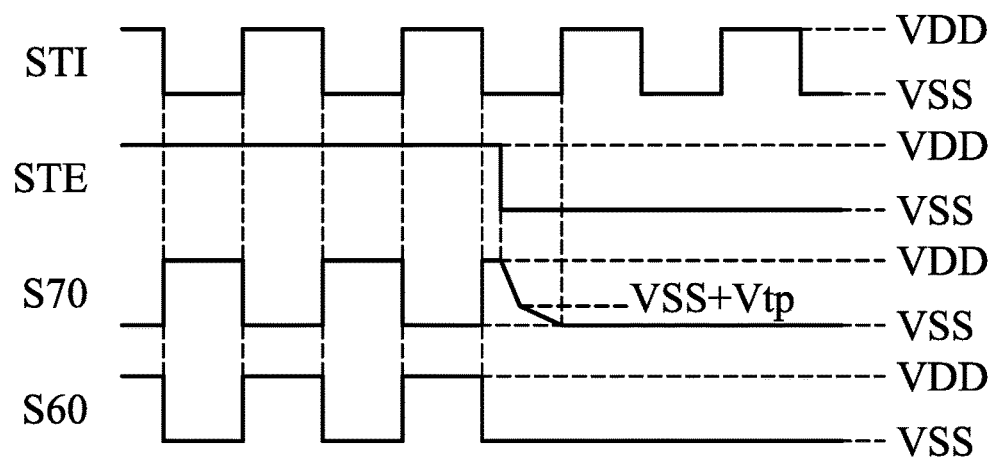

Referring to FIGS. 7 and 8A-8B, when the test-enable signal STE is at the level of the supply voltage VDD, the scan line 1 operates in the test mode. As shown in FIGS. 8A and 8B, during the test mode, the level of the signal S70 is the reverse of the test signal STI through the operation of the inverter 70, while the level of the buffering signal S60 is the reverse of the signal S70 through the operation of the inverter 71. Thus, the level of the buffering signal S60 varies with the variation in the voltage level of the test signal STI, and the phase of the buffering signal S20 is the same as the phase of the test signal STI. Referring to FIG. 7, the power terminal 60A receives the test-enable signal STE. Since the test-enable signal STE is applied to all flip-flop circuits in the scan chain 1, the test-enable signal STE has weak driving strength. Thus, the delay time when the signal S70 is switched to the level of the supply level VDD from the level of the supply voltage VSS is enlarged due to the weak driving strength of the test-enable signal STE. In other words, during the test mode, the rising delay (not shown) of the signal S70 is enlarged. Based on the same reason, the delay time when the buffering signal S60 is switched to the level of the supply level VDD from the level of the supply voltage VSS is enlarged due to the weak driving strength of the test-enable signal STE. In other words, during the test mode, the rising delay (not shown) of the buffering signal S60 is enlarged.

As described above, for one flip-flop circuit 6, since the rising delay of each of the signal S70 and the buffering signal S60 is enlarged, the delay time for the signal received by the flip-flop circuit 6 is also enlarged. Compared with a conventional delay chain, less buffers 60 are applied to achieve a predetermined delay time.

Referring to FIGS. 7 and 8A-8B, when the test-enable signal STE is at the level of the supply voltage VSS, the scan line 1 operates in the normal mode. In some cases, the test-enable signal STE is switched to the level of the supply voltage VSS from the level of the supply voltage VDD during the period when the test signal STI is at the level of the supply voltage VDD, as shown in FIG. 8A. Referring to FIG. 8A, in the short period occurring before the time point when the test-enable signal STE is switched to the level of the supply voltage VSS from the level of the supply voltage VDD (that is, before the time point when the scan chain 1 enters the normal mode from the test mode), since the NMOS transistor 701 is turned on according to the test signal STI with the level of the supply voltage VDD, the level of the signal S70 is already at the level of the supply voltage VSS. During the normal mode, no matter what level the test signal STI is at, the signal S70 is still kept at the level of the supply voltage VSS because of the level of the supply voltage VSS at both of the power terminals 60A and 60B.

Also referring to FIG. 8A, during the period when the signal S70 is at the level of the supply voltage VSS, the PMOS transistor 710 is turned on. In response to the level switching of the test-enable signal STE, the level of the buffering signal S60 starts decreasing toward the level of the sum (VSS+Vtp) of the supply voltage VSS and the threshold Vtp of the PMOS transistor 700 and then decreases toward the level of the supply level VSS from the level of the sum (VSS+Vtp). After the level of the buffering signal S60 reaches the level of the supply voltage VSS during the normal mode, the level of the buffering signal S60 is kept at the level of the supply voltage VSS during the normal mode according to the test-enable signal STE with the level of the supply voltage VSS because the level of the voltage S70 is kept at the level of the supply voltage VSS to turn on the PMOS transistor 710.

In some cases, the test-enable signal STE is switched to the level of the supply voltage VSS from the level of the supply voltage VDD during the period when the test signal STI is at the level of the supply voltage VSS, as shown in FIG. 8B. Referring to FIG. 8B, during the period when the test signal STI is at the level of the supply voltage VSS, the PMOS transistor 700 is turned on. In response to the level switching of the test-enable signal STE, the level of the signal S70 starts decreasing toward the level of the sum (VSS+Vtp) and then decreases toward the level of the supply level VSS from the level of the sum (VDD+Vtp). Once the test signal STI is switched to the level of the supply voltage VDD from the level of the supply voltage VSS to turn on the NMOS transistor 701, the level of the signal S70 is at the level of the supply voltage VSS. Then, the level of the signal S70 is kept at the level of the supply voltage VSS during the normal mode.

Also referring to FIG. 8B, in the short period occurring before the time point when the test-enable signal STE is switched to the level of the supply voltage VSS from the level of the supply voltage VDD (that is, before the time point when the scan chain 1 enters the normal mode from the test mode), since the NMOS transistor 711 is turned on according to the signal S70 with the level of the supply voltage VDD, the level of the buffering signal S60 is already at the level of the supply voltage VSS. During the normal mode, since the PMOS transistor 710 is continuously turned on by the signal S70, the level of the buffering signal S60 is still kept at the level of the supply voltage VSS in response to the test-enable signal STE.

According to the above, when the scan chain 1 enters the normal mode, the level of one of the signal S70 and the buffering signal S60 has one transient, and the level of the other is not changed, which decreases transient power of the buffer 6 during the normal mode.

Figure 9A:
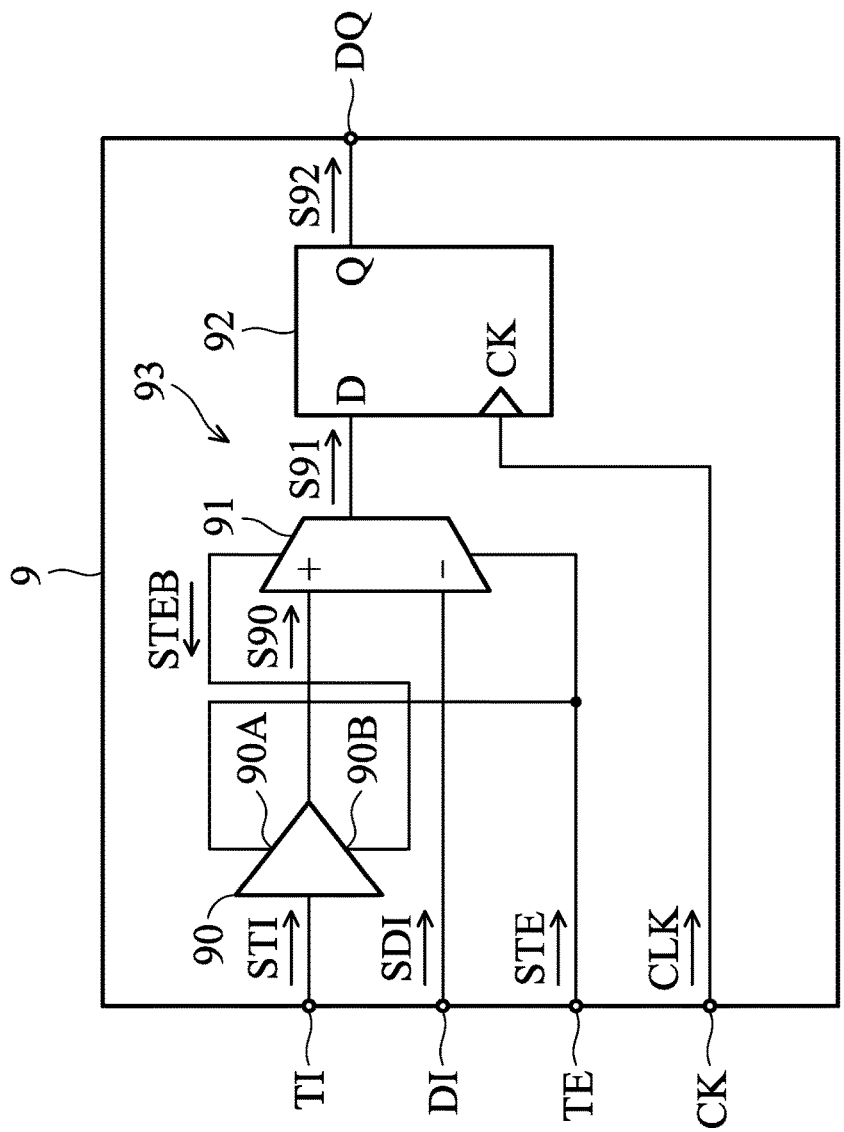
FIG. 9A shows another exemplary embodiment of a flip-flop circuit.

FIG. 9A shows another exemplary embodiment of a flip-flop circuit. At least one of the flip-flop circuits 10-12 shown in FIG. 1 may have the same structure shown in FIG. 9A, that is, at least one of the flip-flop circuits 10-12 may be implemented by the flip-flop circuit 9 of the embodiment of FIG. 9A. As shown in FIG. 9A, the flip-flop circuit 9 comprises a buffer 90 and a scan flip-flop 93. The scan flip-flop 93 comprises a multiplexer 91 and a D flip-flop 92. The connection between the buffer 90, the multiplexer 91, and the D flip-flop 92 and the signals received by them are similar to those in the embodiment of FIG. 2A. Thus, the description related to the similarity is omitted here. The difference between the flip-flop circuits 2 and 9 is that the power terminal S90A of the buffer 90 receives the enable signal STE.

The multiplexer 91 shown in FIG. 9A may have the same structure shown in FIG. 3, that is, the multiplexer 91 may be implemented by the multiplexer 3 of the embodiment of FIG. 3. The structure of the multiplexer 3 has been described above, thus, the related description is omitted here. In the embodiment where the multiplexer 91 is implemented by the multiplexer 3, the AND gate 30 receives the buffering signal S90 generated by the buffer 90 to serve as the scan-in signal SSI, and the OR gate 32 outputs its output signal to serve as the input signal S91.

Figure 9B:
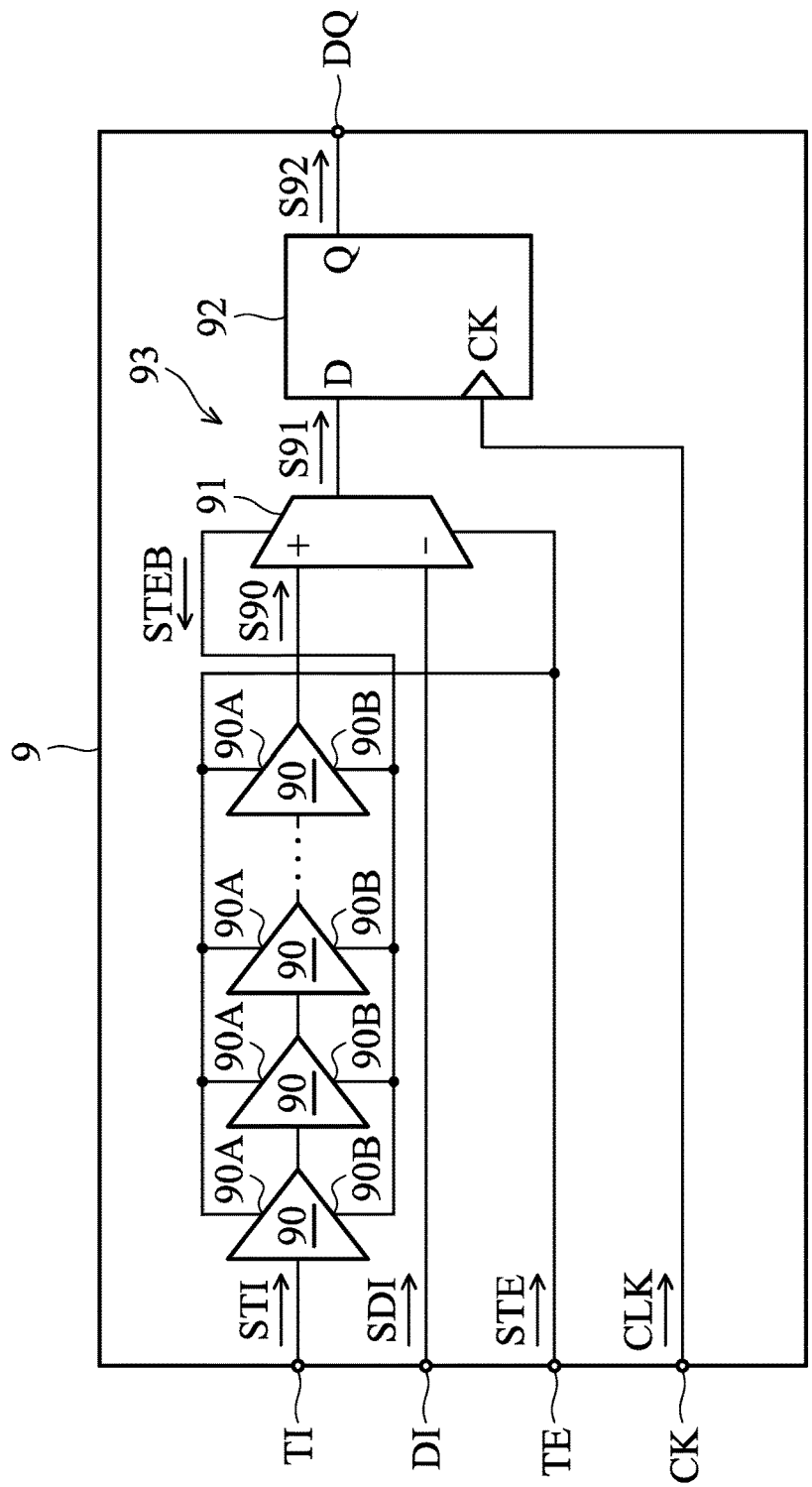
FIG. 9B shows another exemplary embodiment of a flip-flop circuit.

In the embodiment of FIG. 9A, there is one buffer 90 in the flip-flop circuit 9. However, in other embodiments, the flip-flop circuit 9 may comprise several buffers 90 coupled in series to obtain longer delay time for the test signal STI, as shown in FIG. 9B. Accordingly, the buffers 90 operate together to generate the buffering signal S90 according to the test signal STI.

Figure 10:
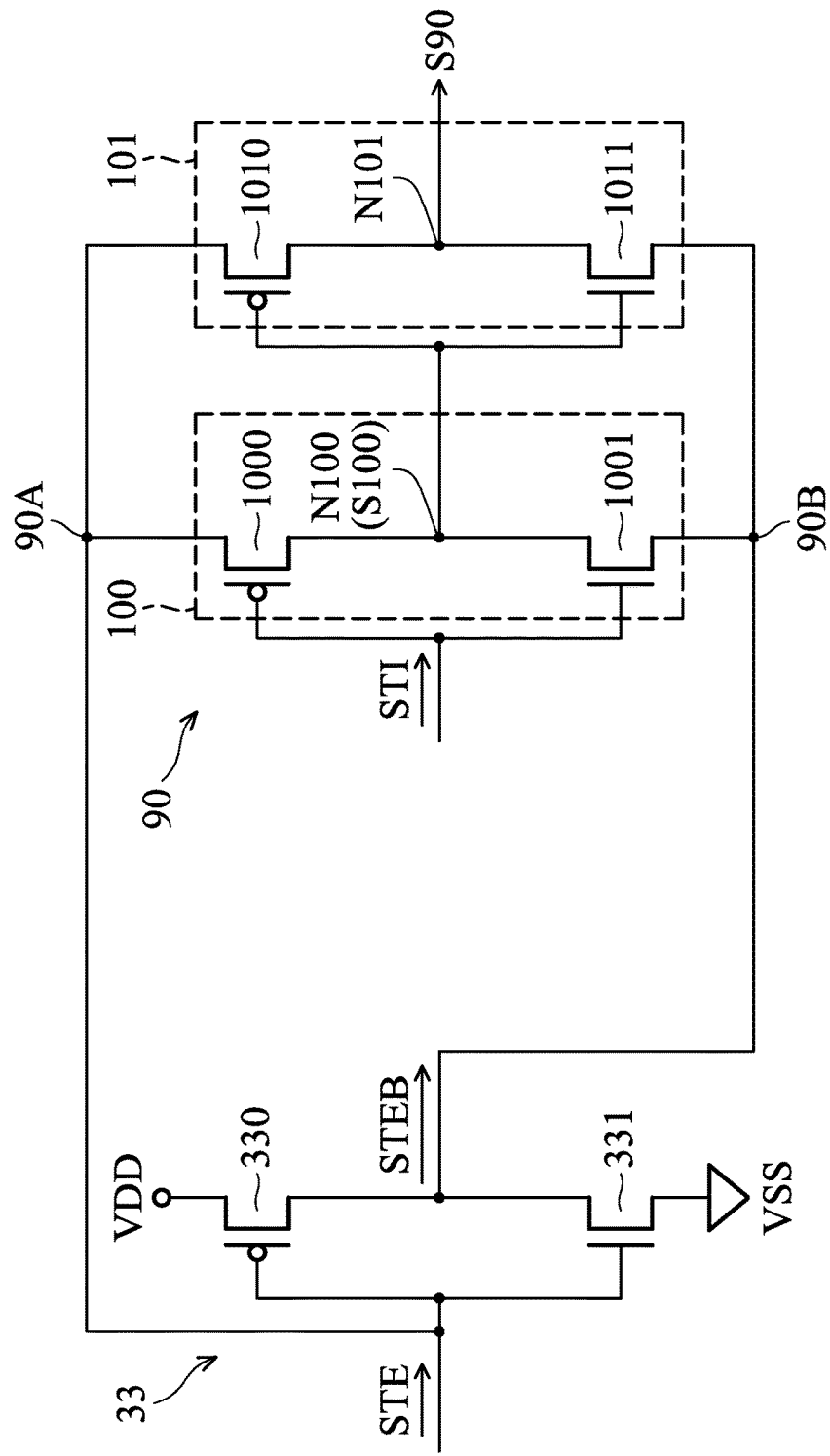
FIG. 10 shows an exemplary embodiment of a buffer in the flip-flop circuit of FIG. 9A.

FIG. 10 shows an exemplary embodiment of the buffer 90 (such as FIGS. 9A and 9B shows). In order to illustrate the structure and operation of the buffer 90, FIG. 7 also shows the inverter 33 in the multiplexer 3. The structure of the inverter 33 has been described above, thus, the related description is omitted here.

Also referring to FIG. 10, the buffers 100 comprises inverters 100 and 101. The inverter 100 is composed of a PMOS transistor 1000 and an NMOS transistor 1001. The gate of the PMOS transistor 1000 receives the test signal STI, the source thereof is coupled to the power terminal 90A to receive the test-enable signal STE, and the drain thereof is coupled to a node N100. The gate of the NMOS transistor 1001 receives the test signal STI, the drain thereof is coupled to the node N100, and the source thereof is coupled to the power terminal 90B to receive the test-enable reverse signal STEB. There is a signal S100 generated at the node N100. The inverter 101 is composed of a PMOS transistor 1010 and an NMOS transistor 1011. The gate of the PMOS transistor 1010 is coupled to the node N100 to receive the signal S100, the source thereof is coupled to the power terminal 90A to receive the test-enable signal STE, and the drain thereof is coupled to a node N101. The gate of the NMOS transistor 1011 is coupled to the node N100 to receive the signal S100, the drain thereof is coupled to the node N71, and the source thereof is coupled to the power terminal 90B to receive the test-enable reverse signal STEB. The buffering signal S90 is generated at the node N71.

Figure 11:
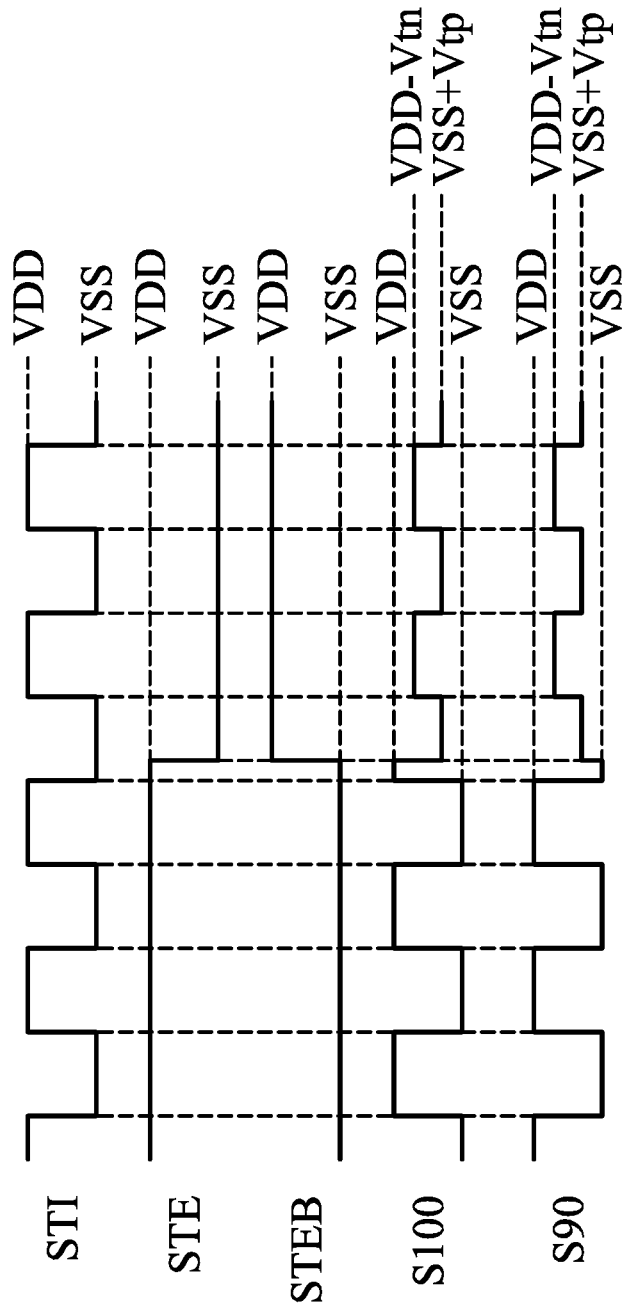
FIG. 11 is a schematic view showing timing chart of main signals of the flip-flop circuit of FIG. 9A in various cases.

Referring to FIGS. 10 and 11, when the test-enable signal STE is at the level of the supply voltage VDD, the scan line 1 operates in the test mode. Through the inverter 33, the test-enable reverse signal STEB is at the level of the supply voltage VSS, during the test mode. As shown in FIG. 10, during the test mode, the level of the signal S100 is the reverse of the test signal STI through the operation of the inverter 100, while the level of the buffering signal S90 is the reverse of the signal S100 through the operation of the inverter 101. Thus, the level of the buffering signal S900 varies with the variation in the voltage level of the test signal STI, and the phase of the buffering signal S90 is the same as the phase of the test signal STI.

Referring to FIGS. 10 and 11, when the test-enable signal STE is at the level of the supply voltage VSS, the scan line 1 operates in the normal mode. Through the inverter 33, the test-enable reverse signal STEB is the level of the supply voltage VDD during the test mode. In some cases, the test-enable signal STE is switched to the level of the supply voltage VSS from the level of the supply voltage VDD (that is, the test-enable reverse signal STEB is switched to the level of the supply voltage VDD from the level of the supply voltage VSS) during the period when the test signal STI is at the level of the supply voltage VSS, as shown in FIG. 11. Referring to FIG. 11, in the short period occurring before the time point when the test-enable signal STE is switched to the level of the supply voltage VSS from the level of the supply voltage VDD (that is, before the time point when the scan chain 1 enters the normal mode from the test mode), since the PMOS transistor 1000 is turned on according to the test signal STI with the level of the supply voltage VSS, the level of the signal S100 is at the level of the supply voltage VDD according to the test-enable signal STE with the level of the supply voltage VDD. When the test-enable signal STE is switched to the level of the supply voltage VSS from the level of the supply voltage VDD during the period when the test signal STI is at the level of the supply voltage VSS, the signal S100 is switched to the level of the sum (VSS+Vtp) from the voltage of the supply voltage VDD. During the test mode, the signal S100 is switched to the level of the difference (VDD−Vtn) according to the test-enable reverse signal STEB with the voltage of the supply voltage VDD once the test signal STI is switched to the level of the supply voltage VDD, while the signal S100 is switched to the level of the sum (VSS+Vtp) according to the test-enable signal STE with the voltage of the supply voltage VSS once the test signal STI is switched to the level of the supply voltage VSS. In other words, during the normal mode, the signal S100 is switched between the level of the difference (VDD−Vtn) and the level of the sum (VSS+Vtp).

Also referring to FIG. 11, during the normal mode, through the operation of the inverter 101 based on the signal S100 and the test-enable signals STE and the test-enable reverse signal STEB, the buffering signal S90 is also switched between the level of the difference (VDD−Vtn) and the level of the sum (VSS+Vtp).

In some cases, the test-enable signal STE is switched to the level of the supply voltage VSS from the level of the supply voltage VDD (that is, the test-enable reverse signal STEB is switched to the level of the supply voltage VDD from the level of the supply voltage VSS) during the period when the test signal STI is at the level of the supply voltage VDD. During the normal mode, through the operation buffer 90, both the signal S100 and the buffering signal S90 are switched between the level of the difference (VDD−Vtn) and the level of the sum (VSS+Vtp).

According to the above embodiment, the amplitude of the levels of the signal S100 and the buffering signal S90 during the normal mode is less that during the test mode, thereby decreasing the power consumption during the normal mode.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flip-flop circuit for receiving a test signal at a test-in terminal and a data signal at a data-in terminal and generating a scan-out signal, comprising:
   a buffer having an input terminal coupled to the test-in terminal and an output terminal and further having a first power terminal and a second power terminal, wherein the buffer operates to generate a buffering signal; and
   a scan flip-flop receiving the buffering signal and the data signal and controlled by a test-enable signal to generate the scan-out signal according to the buffering signal or the data signal,
   wherein the scan flip-flop further generates a test-enable reverse signal which is the reverse of the test-enable signal, and
   wherein the first power terminal of the buffer receives the test-enable signal or the test-enable reverse signal.

2. The flip-flop circuit as claimed in claim 1, wherein the scan flip-flop comprises:
   a multiplexer having a first input terminal and a second input terminal and controlled by the test-enable signal to transmit the buffering signal or the data signal to serve as an input signal; and
   a flip-flop receiving the input signal and generating the scan-out signal according to the input signal.

3. The flip-flop circuit as claimed in claim 1,
   wherein the first power terminal of the buffer receives the test-enable reverse signal, and the second power terminal of the buffer receives a high supply voltage;
   wherein the buffer comprises:
      a first P-type transistor having a gate terminal coupled to the input terminal of the buffer, a source terminal coupled to the second power terminal, and a drain terminal coupled to a first node;
      a first N-type transistor having a gate coupled to the input terminal of the buffer, a drain terminal coupled to the first node, and a source coupled to the first power terminal;
      a second P-type transistor having a gate terminal coupled to the first node, a source terminal coupled to the second power terminal, and a drain terminal coupled to the output terminal of the buffer; and
      a second N-type transistor having a gate coupled to the first node, a drain terminal coupled to the output terminal of the buffer, and a source coupled to the first power terminal.

4. The scan output flip-flop as claimed in claim 1,
   wherein the first power terminal of the buffer receives the test-enable signal, and the second power terminal of the buffer receives a low supply voltage;
   wherein the buffer comprises:
      a first P-type transistor having a gate terminal coupled to the input terminal of the buffer, a source terminal coupled to the first power terminal, and a drain terminal coupled to a first node;
      a first N-type transistor having a gate coupled to the input terminal of the buffer, a drain terminal coupled to the first node, and a source coupled to the second power terminal;
      a second P-type transistor having a gate terminal coupled to the first node, a source terminal coupled to the first power terminal, and a drain terminal coupled to the output terminal of the buffer; and
      a second N-type transistor having a gate coupled to the first node, a drain terminal coupled to the output terminal of the buffer, and a source coupled to the second power terminal.

5. The flip-flop circuit as claimed in claim 1,
   wherein the first power terminal of the buffer receives the test-enable signal, and the second power terminal of the buffer receives the test-enable reverse signal;
   wherein the buffer comprises:
      a first P-type transistor having a gate terminal coupled to the input terminal of the buffer, a source terminal coupled to the first power terminal, and a drain terminal coupled to a first node;
      a first N-type transistor having a gate coupled to the input terminal of the buffer, a drain terminal coupled to the first node, and a source coupled to the second power terminal;
      a second P-type transistor having a gate terminal coupled to the first node, a source terminal coupled to the first power terminal, and a drain terminal coupled to the output terminal of the buffer; and
      a second N-type transistor having a gate coupled to the first node, a drain terminal coupled to the output terminal of the buffer, and a source coupled to the second power terminal.

6. The flip-flop circuit claimed in claim 1,
   wherein the flip-flop circuit is powered by a high supply voltage and a low supply voltage which is lower than the high supply voltage,
   wherein the first power terminal of the buffer receives the test-enable reverse signal, and the second power terminal of the buffer receives the high supply voltage.

7. The flip-flop circuit claimed in claim 1,
   wherein the flip-flop circuit is powered by a high supply voltage and a low supply voltage which is lower than the high supply voltage,
   wherein the first power terminal of the buffer receives the test-enable signal, and the second power terminal of the buffer receives the low supply voltage.

8. The flip-flop circuit claimed in claim 1,
   wherein the flip-flop circuit is powered by a high supply voltage and a low supply voltage which is lower than the high supply voltage,
   wherein the first power terminal of the buffer receives the test-enable signal, and the second power terminal of the buffer receives the test-enable reverse signal.

9. The flip-flop circuit as claimed in claim 1, wherein the scan flip-flop comprises:
- an inverter receiving the test-enable signal and generating the test-enable reverse signal;
- a first AND gate having a first input terminal receiving the buffering signal, a second input terminal receiving the second test signal, and an output terminal;
- a second AND gate having a first input terminal receiving the data signal, a second input terminal receiving the second test signal, and an output terminal generating
- an OR gate having a first input terminal coupled to the output terminal of the first AND gate, a second input terminal coupled to the output terminal of the second AND gate, and an output terminal generating an input terminal; and
- a flip-flop receiving the input signal and generating the scan-out signal according to the input signal.

10. The flip-flop circuit as claimed in claim 1,
- wherein when the flip-flop circuit operates in a test mode, the scan flip-flop is controlled by the test-enable signal to generate the scan-out signal according to the buffering signal, and
- wherein when the flip-flop circuit operates in a normal mode, the scan flip-flop is controlled by the test-enable signal to generate the scan-out signal according to the data signal.

11. A scan chain comprising:
- a first flip-flop circuit and a second flip-flop circuit, each of the first and second flip-flop circuits receiving a test signal at a test-in terminal, receiving a data signal at a data-in terminal, receiving a test-enable signal at a test-enable terminal, and generating a scan-out signal at a date-out terminal; and
- a combinatorial logic circuit, coupled between the data-out terminal of the first flip-flop circuit and the data-in terminal of the second flip-flop circuit,
- wherein the second flip-flop circuit receives the scan-out signal generated by the first flip-flop circuit through the corresponding the test-in terminal to serve as the test signal for the second flip-flop, and
- wherein each of the first and second flip-flop circuits comprises:
  - a buffer having an input terminal coupled to the test-in terminal from the test-in terminal and an output terminal and further having a first power terminal and a second power terminal, wherein the buffer operates to generate a buffering signal; and
  - a scan flip-flop receiving the buffering signal and the data signal and controlled by the test-enable signal to generate the scan-out signal according to the buffering signal or the data signal,
    - wherein the scan flip-flop further generates a test-enable reverse signal which is the reverse of the test-enable signal, and
    - wherein the first power terminal of the buffer receives the test-enable signal or the test-enable reverse signal.

12. The scan chain circuit as claimed in claim 11, wherein for each of the first and second flip-flop circuits, the scan flip-flop comprises:
- a multiplexer having a first input terminal and a second input terminal and controlled by the test-enable signal to transmit the buffering signal or the data signal to serve as an input signal; and
- a flip-flop receiving the input signal and generating the scan-out signal according to the input signal.

13. The scan chain as claimed in claim 11,
- wherein for each of the first and second flip-flop circuits, the first power terminal of the buffer receives the test-enable reverse signal, and the second power terminal of the buffer receives a high supply voltage;
- wherein for each of the first and second flip-flop circuits, the buffer comprises:
  - a first P-type transistor having a gate terminal coupled to the input terminal of the buffer, a source terminal coupled to the second power terminal, and a drain terminal coupled to a first node (N40);
  - a first N-type transistor having a gate coupled to the input terminal of the buffer, a drain terminal coupled to the first node, and a source coupled to the first power terminal;
  - a second P-type transistor having a gate terminal coupled to the first node, a source terminal coupled to the second power terminal, and a drain terminal coupled to the output terminal of the buffer; and
  - a second N-type transistor having a gate coupled to the first node, a drain terminal coupled to the output terminal of the buffer, and a source coupled to the first power terminal.

14. The scan chain as claimed in claim 11,
- wherein for each of the first and second flip-flop circuits, the first power terminal of the buffer receives the test-enable signal, and the second power terminal of the buffer receives a low supply voltage;
- wherein for each of the first and second flip-flop circuits, the buffer comprises:
  - a first P-type transistor having a gate terminal coupled to the input terminal of the buffer, a source terminal coupled to the first power terminal, and a drain terminal coupled to a first node;
  - a first N-type transistor having a gate coupled to the input terminal of the buffer, a drain terminal coupled to the first node, and a source coupled to the second power terminal;
  - a second P-type transistor having a gate terminal coupled to the first node, a source terminal coupled to the first power terminal, and a drain terminal coupled to the output terminal of the buffer; and
  - a second N-type transistor having a gate coupled to the first node, a drain terminal coupled to the output terminal of the buffer, and a source coupled to the second power terminal.

15. The scan chain as claimed in claim 11,
- wherein for each of the first and second flip-flop circuits, the first power terminal of the buffer receives the test-enable signal, and the second power terminal of the buffer receives the test-enable reverse signal;
- wherein for each of the first and second flip-flop circuits, the buffer comprises:
  - a first P-type transistor having a gate terminal coupled to the input terminal of the buffer, a source terminal coupled to the first power terminal, and a drain terminal coupled to a first node;
  - a first N-type transistor having a gate coupled to the input terminal of the buffer, a drain terminal coupled to the first node, and a source coupled to the second power terminal;
  - a second P-type transistor having a gate terminal coupled to the first node, a source terminal coupled to the first power terminal, and a drain terminal coupled to the output terminal of the buffer; and a second N-type transistor having a gate coupled to the first node, a drain terminal coupled to the output terminal of the buffer, and a source coupled to the second power terminal.

16. The scan chain claimed in claim 11,
wherein the first and second flip-flop circuits are powered by a high supply voltage and a low supply voltage which is lower than the high supply voltage,
wherein for each of the first and second flip-flop circuits, the first power terminal of the buffer receives the test-enable reverse signal, and the second power terminal of the buffer receives the high supply voltage.

17. The scan chain claimed in claim 11,
wherein the first and second flip-flop circuits are powered by a high supply voltage and a low supply voltage which is lower than the high supply voltage,
wherein for each of the first and second flip-flop circuits, the first power terminal of the buffer receives the test-enable signal, and the second power terminal of the buffer receives the low supply voltage.

18. The scan chain claimed in claim 11,
wherein the first and second flip-flop circuits are powered by a high supply voltage and a low supply voltage which is lower than the high supply voltage,
wherein for each of the first and second flip-flop circuits, the first power terminal of the buffer receives the test-enable signal, and the second power terminal of the buffer receives the test-enable reverse signal.

19. The scan chain as claimed in claim 11, wherein for each of the first and second flip-flop circuits, the scan flip-flop comprises:
an inverter receiving the test-enable signal and generating the test-enable reverse signal;
a first AND gate having a first input terminal receiving the buffering signal, a second input terminal receiving the second test signal, and an output terminal;
a second AND gate having a first input terminal receiving the data signal, a second input terminal receiving the second test signal, and an output terminal generating
an OR gate having a first input terminal coupled to the output terminal of the first AND gate, a second input terminal coupled to the output terminal of the second AND gate, and an output terminal generating an input terminal; and
a flip-flop receiving the input signal and generating the scan-out signal according to the input signal.

20. The scan chain as claimed in claim 11,
wherein for each of the first and second flip-flop circuits, when the scan chain operates in a test mode, the scan flip-flop is controlled by the test-enable signal to generate the scan-out signal according to the buffering signal, and
wherein each of the first and second flip-flop circuits, when the scan chain operates in a normal mode, the scan flip-flop is controlled by the test-enable signal to generate the scan-out signal according to the data signal.

* * * * *